United States Patent
Kim et al.

(10) Patent No.: US 10,756,301 B2
(45) Date of Patent: Aug. 25, 2020

(54) ELECTRONIC DEVICE HAVING STACKING STRUCTURE COMPRISING TWO DIMENSIONAL MATERIALS

(71) Applicants: SAMSUNG ELECTRONICS CO., LTD., Suwon-si (KR); RESEARCH & BUSINESS FOUNDATION SUNGKYUNKWAN UNIVERSITY, Suwon-si (KR)

(72) Inventors: Unjeong Kim, Osan-si (KR); Younggeun Roh, Seoul (KR); Jaehyun Kwon, Hwaseong-si (KR); Younghee Lee, Suwon-si (KR); Hyeyun Jeong, Suwon-si (KR)

(73) Assignees: SAMSUNG ELECTRONICS CO., LTD., Suwon-si (KR); RESEARCH & BUSINESS FOUNDATION SUNGKYUNKWAN UNIVERSITY, Suwon-Si (KR)

( * ) Notice: Subject to any disclaimer, the term of this patent is extended or adjusted under 35 U.S.C. 154(b) by 0 days.

(21) Appl. No.: 15/807,825

(22) Filed: Nov. 9, 2017

(65) Prior Publication Data
US 2018/0205038 A1    Jul. 19, 2018

(30) Foreign Application Priority Data
Jan. 19, 2017    (KR) .......................... 10-2017-0009378

(51) Int. Cl.
| H01L 33/00 | (2010.01) |
| H01L 51/52 | (2006.01) |
| H01L 51/56 | (2006.01) |
| G02B 5/08 | (2006.01) |
| H01L 51/50 | (2006.01) |

(52) U.S. Cl.
CPC ........ *H01L 51/5265* (2013.01); *G02B 5/0833* (2013.01); *H01L 33/00* (2013.01); *H01L 51/5012* (2013.01); *H01L 51/56* (2013.01); *H01L 2251/301* (2013.01)

(58) Field of Classification Search
CPC ... G02B 5/0833; H01L 33/00; H01L 51/5012; H01L 51/56
USPC ...................................... 257/40, 98
See application file for complete search history.

(56) References Cited

U.S. PATENT DOCUMENTS

| 2014/0251204 A1 | 9/2014 | Najmaei et al. |
| 2016/0043270 A1 | 2/2016 | Li et al. |
| 2017/0098716 A1* | 4/2017 | Li ....................... H01L 29/7391 |

FOREIGN PATENT DOCUMENTS

| KR | 10-2013-0134828 A | 12/2013 |
| KR | 10-2015-0134816 A | 12/2015 |

* cited by examiner

*Primary Examiner* — Tan N Tran
(74) *Attorney, Agent, or Firm* — Sughrue Mion, PLLC

(57) ABSTRACT

An electronic device having a stacking structure including a plurality of 2D material layers is provided. The stacking structure includes a first 2D material layer, among the plurality of 2D material layers, stacked adjacent to a second 2D material layer, among the plurality of 2D material layers, and the first 2D material layer is rotated with respect to the second 2D material layer.

19 Claims, 6 Drawing Sheets

ELECTRONIC DEVICE HAVING STACKING STRUCTURE COMPRISING TWO DIMENSIONAL MATERIALS

CROSS-REFERENCE TO RELATED APPLICATION

This application claims priority from Korean Patent Application No. 10-2017-0009378, filed on Jan. 19, 2017, in the Korean Intellectual Property Office, the disclosure of which is incorporated herein by reference in its entirety.

BACKGROUND

1. Field

The present disclosure relates to electronic devices having a stacking structure including a two-dimensional material.

2. Description of the Related Art

As the electronic industry develops, the demand for miniaturization and high integration of electronic devices has increased, and thus, studies related to the electronic devices have been conducted. Environments in which the electronic devices are used require that the electronic devices be smaller in size. As the necessity of electronic devices having a small size and high performance is increased, interests with respect to two-dimensional materials and electronic devices including the 2D material have been increased.

A 2D material may denote a material having a single-layer structure in which atoms form a predetermined crystal structure. The 2D material draws intentions as a next generation material that can overcome a limit of existing material. The 2D material may be applied to various devices, but it cannot be used without a certain limitation.

SUMMARY

Exemplary embodiments may address at least the above problems and/or disadvantages and other disadvantages not described above. Also, the exemplary embodiments are not required to overcome the disadvantages described above, and an exemplary embodiment may not overcome any of the problems described above.

Exemplary embodiments may provide stacking structures including a plurality of 2D material layers.

Exemplary embodiments may provide electronic devices having the stacking structures including a plurality of 2D material layers.

According to an exemplary embodiment, there is provided an electronic device comprising: a stacking structure comprising a plurality of two-dimensional (2D) material layers, wherein a first 2D material layer, among the plurality of 2D material layers, is stacked adjacent to and a second 2D material layer, among the plurality of 2D material layers, and wherein the first 2D material layer is rotated with respect to the second 2D material layer.

The first 2D material layer may be rotated with respect to the second 2D material layer by a predetermined angle greater than zero.

The first 2D material layer and the second 2D material may be stacked in a twisted state.

The first 2D material layer and the second 2D material layer may have a same stacking direction, and the predetermined angle may range from 20 degrees to 40 degrees based on a direction perpendicular to a wide stacking surface.

The 2D material layers may comprise a metal chalcogenide based material.

The 2D material layers may comprise a transition metal dichalcogenide (TMD).

The 2D material layers may comprise MoS2, MoSe2, MoTe2, WS2, WSe2, WTe2, HfS2, HfSe2, ZrS2, ZrSe2, NbSe2, or ReSe2.

The electronic device may further comprise: a first layer and a second layer formed on a substrate or a lower structure; a first electrode electrically connected to the first layer; and a second electrode electrically connected to the second layer, wherein at least one of the first layer and the second layer is the stacking structure.

The first layer is a p-type material layer and the second layer may be an n-type material layer.

One of the first layer and the second layer may comprise a 2D material layer.

The 2D material layer may comprise a TMD material.

The electronic device may further comprise: a first reflection layer formed on a substrate or a lower structure; the stacking structure formed on the first reflection layer; and a second reflection layer formed on the stacking structure.

The first and second reflection layers may be a distributed Bragg reflection (DBR) stacking structure or a distributed feedback (DFB) stacking structure.

The electronic device may further comprise: a first electrode formed between the substrate and the first reflection layer; and a second electrode formed on the second reflection layer.

The 2D material layers may comprise a TMD material.

The electronic device may further comprise: a first electrode formed on a substrate; an electron transfer layer formed on the first electrode; the stacking structure formed on the electron transfer layer; a hole transfer layer formed on the stacking structure; a conductive polymer layer formed on the hole transfer layer; and a second electrode formed on the hole transfer layer.

The 2D material layers may comprise a TMD material.

According to another exemplary embodiment, there is provided a stacked structure comprising: a plurality of two-dimensional (2D) material layers, wherein a first 2D material layer, among the plurality of 2D material layers, is stacked adjacent to a second 2D material layer, among the plurality of 2D material layers, and wherein the first 2D material layer is rotated with respect to the second 2D material layer.

According to another exemplary embodiment, there is provided a method of forming a stacked structure, comprising: forming a first two-dimensional (2D) material layer by supplying gas material on a substrate placed on a platform; rotating the first 2D material on the platform by a predetermined angle; and forming a second two-dimensional (2D) material layer by supplying the gas material on the first 2D material layer.

The predetermined angle may range from 20 degrees to 40 degrees based on a direction perpendicular to a wide stacking surface.

BRIEF DESCRIPTION OF THE DRAWINGS

The above and other aspects of the exemplary embodiments will become apparent and more readily appreciated from the following description of certain exemplary embodiments, taken in conjunction with the accompanying drawings in which.

DETAILED DESCRIPTION

Figure 1:
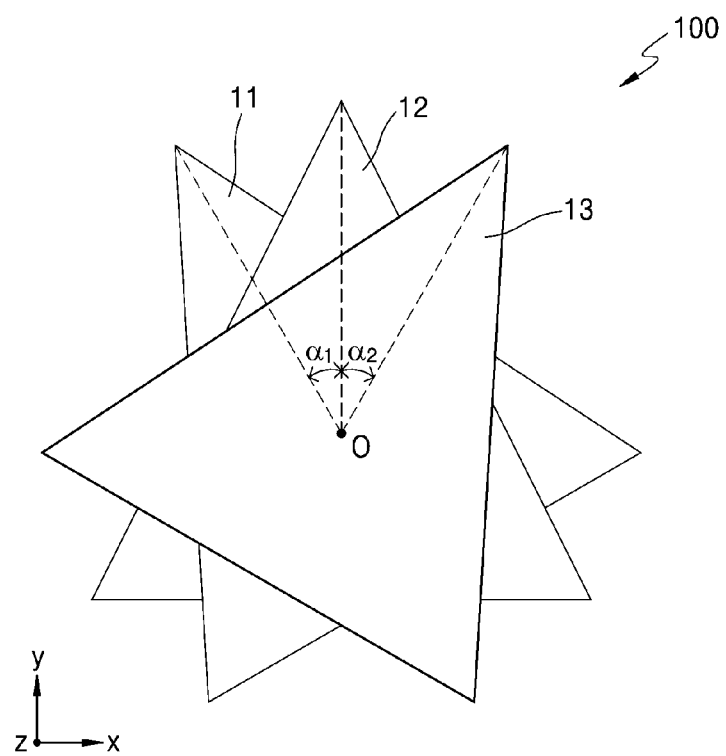
FIG. 1 is a drawing illustrating a stacking structure including two-dimensional (2D) material layers according to an exemplary embodiment.

Hereinafter, one of more exemplary embodiments of a stacking structure including a plurality of 2D material layers and one of more exemplary embodiments of an electronic device will now be described in detail with reference to the accompanying drawings. The scope of the present disclosure, however, should not be construed as limited to the exemplary embodiments set forth herein. In the drawings, thicknesses of layers and regions may be exaggerated for clarity of layers and regions Like reference numerals are used to like elements throughout the specification. When a layer, a film, a region, or a panel is referred to as being "on" another element, it can be directly on the other layer or substrate, or intervening layers may also be present.

FIG. 1 is a drawing showing a stacking structure 100 including two-dimensional (2D) material layers according to an example embodiment.

Referring to FIG. 1, the stacking structure 100 including 2D material layers may include at least two 2D material layers 11, 12, and 13, for example, a first 2D material layer 11, a second 2D material layer 12, and a third 2D material layer 13. The first through third 2D material layers 11, 12, and 13 may have the same stacking direction, that is, a z-direction with each other. However, stacking surfaces of the first through third 2D material layers 11, 12, and 13 included in the stacking structure 100 may be stacked with a predetermined angle twisting with each other, that is, may be stacked in a rotated state. In detail, the first through third 2D material layers 11, 12, and 13 respectively may be stacked by being twisted with a predetermined angle. That is, according to an exemplary embodiment, the first through third 2D material layers 11, 12, and 13 respectively may be rotated based on stacking surfaces of the first through third 2D material layers 11, 12, and 13. For example, an axis perpendicular to a point "O" on a x-y surface of the first through third 2D material layers 11, 12, and 13 respectively may be rotated based on the z-axis. In this manner, 2D material layers of the first through third 2D material layers 11, 12, and 13 adjacent to each other may have the same stacking direction (z-direction). According to an exemplary embodiment, a twisted angle, that is, a rotated angle with respect to a direction perpendicular to a wide stacking surface (x-y surface), that is, the stacking direction (z-direction) is referred to as a stacking angle.

In detail, the second 2D material layer 12 may be formed on the first 2D material layer 11, and the first and second 2D material layers 11 and 12 may be stacked with a twisted state by a predetermined angle α1, that is, in a rotated state based on the wide stacking surfaces of the first and second 2D material layers 11 and 12. Also, the third 2D material layer 13 may be formed on the second 2D material layer 12, and the second and third 2D material layers 12 and 13 may be stacked with a twisted state by a predetermined angle α2, that is, in a rotated state based on the wide stacking surfaces of the second and third 2D material layers 12 and 13. Here, a difference of a stacking angle α1 between the first and second 2D material layers 11 and 12 and a difference of stacking angle α2 between the second and third 2D material layers 12 and 13 may be in a range from 20 degrees to 40 degrees.

The stacking angles α1 and α2 between the first through third 2D material layers 11, 12, and 13 of the stacking structure 100 may be applied between the surfaces that directly contact with each other in the stacking direction (z-direction), for example, may be applied to the first and second 2D material layers 11 and 12 that directly contact each other or may be applied to the second and third 2D material layers 12 and 13 that directly contact each other.

In the exemplary embodiment, the first through third 2D material layers 11, 12, and 13 of the stacking structure 100 may be material layers formed by including 2D materials. Here, in the 2D materials, atoms may constitute a predetermined crystal structure and may have a single layer structure.

The first through third 2D material layers 11, 12, and 13 may include a metal chalcogenide based material. The metal chalcogenide based material may be a transition metal dichalcogenide (TMD) material including a transition metal and a dichalcogenide material. Here, the transition metal may be at least one of Mo, W, Nb, V, Ta, Ti, Zr, Hf, Tc, and Re. The dichalcogenide material may be at least one of S, Se, and Te. The TMD material may be expressed as a chemical formula of $MX_2$, where X may be a dichalcogen atom, for example, S, Se, and Te, and M may be a transition metal, for example, Mo, W, Nb, V, Ta, Ti, Zr, Hf, Tc, and Re. In detail, the TMD material may include $MoS_2$, $MoSe_2$, $MoTe_2$, $WS_2$, $WSe_2$, $WTe_2$, $HfS_2$, $HfSe_2$, $NbSe_2$, $ReSe_2$, $ZrS_2$, and $ZrSe_2$.

If the TMD material has a monolayer structure, the TMD material may have a direct transition or direct bandgap characteristic. If the TMD material has a multilayer structure, the TMD material may have a indirect bandgap characteristic. According to an exemplary embodiment, the TMD material may be a bilayer structure, a trilayer structure, or a structure having four or more layers. According to an aspect, if the TMD material has a monolayer structure, emission efficiency per thickness may be increased, but due to a very small thickness, the TMD material may have a very low light absorbency, and as a result, emission efficiency may be reduced, which will be described with reference to FIG. 2.

Figure 2:
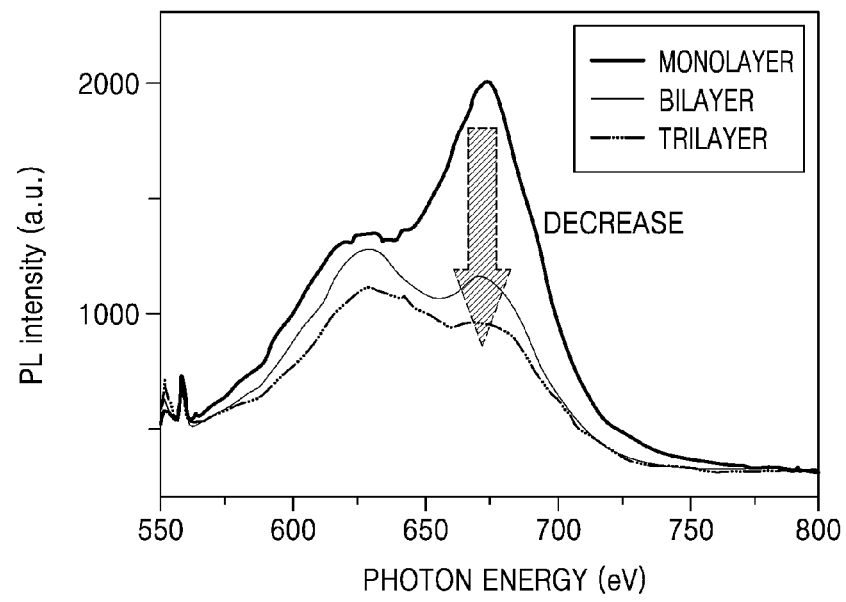
FIG. 2 is a graph illustrating a photoluminescence (PL) intensity with respect to a photon energy when 2D material layers are formed in a multilayer structure.

FIG. 2 is a graph illustrates a photoluminescence (PL) intensity with respect to a photon energy when 2D material layers are formed in a multilayer structure.

Referring to FIG. 2, PL intensities were measured by forming a stacking structure of a $MoS_2$ trilayer by using $MoS_2$ as a 2D material. The measurement result of the PL intensities with respect to photon energy shows that the intensity of an exciton A located at approximately 670 nm was greatly reduced as the number of stacking the 2D material ($MoS_2$) layer is increased, and the intensity of an exciton B located at approximately 630 nm was reduced relatively small as the increase in the number of stacking the 2D material layer compared to the case of the exciton A. That is, in a stacking structure including 2D material layers, the PL intensity reduces as the number of stacking of the 2D material layers increases.

As described above, if the stacking structure 100 including 2D material layers has a monolayer structure, a thickness of the stacking structure 100 is a very small. In order to increase light emission efficiency thereof, according to an exemplary embodiment, the stacking structure 100 may be formed as a multilayer structure. However, the stacking structure 100 may have an indirect bandgap characteristic when the stacking structure 100 has a multilayer structure, and thus, the increase in the light emission efficiency may be reduced. However, in the stacking structure 100 including 2D material layers according to the exemplary embodiment, the 2D material layers are stacked in a twisted state, that is a rotated state by an angle in a range from 20 degrees to 40 degrees based on a wide stacking surface between the 2D material layers that directly contact each other, thereby increasing light emission efficiency.

Figure 3:
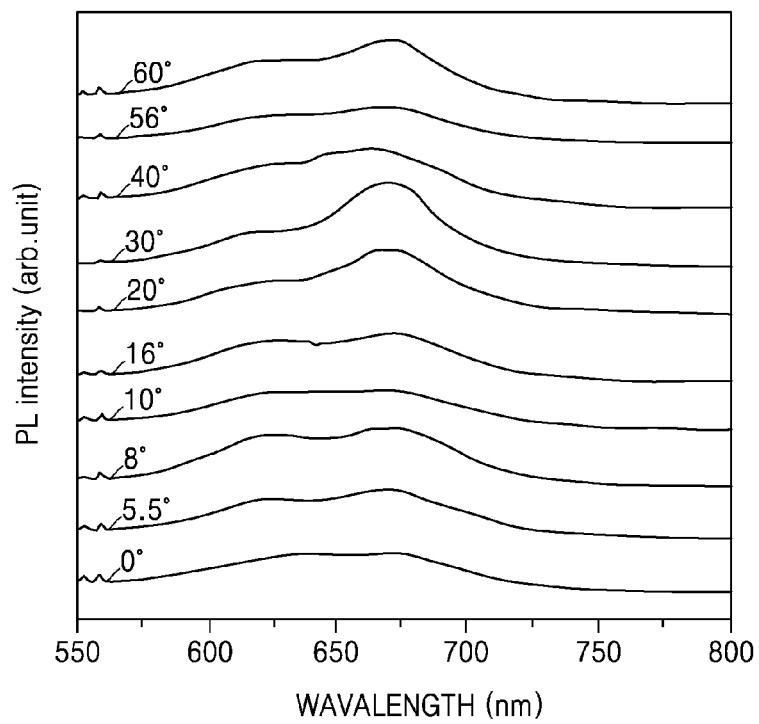
FIG. 3 is a graph illustrating PL intensities according to a stacking angle of two layers after forming a stacking structure having two 2D material layers.
Figure 4:
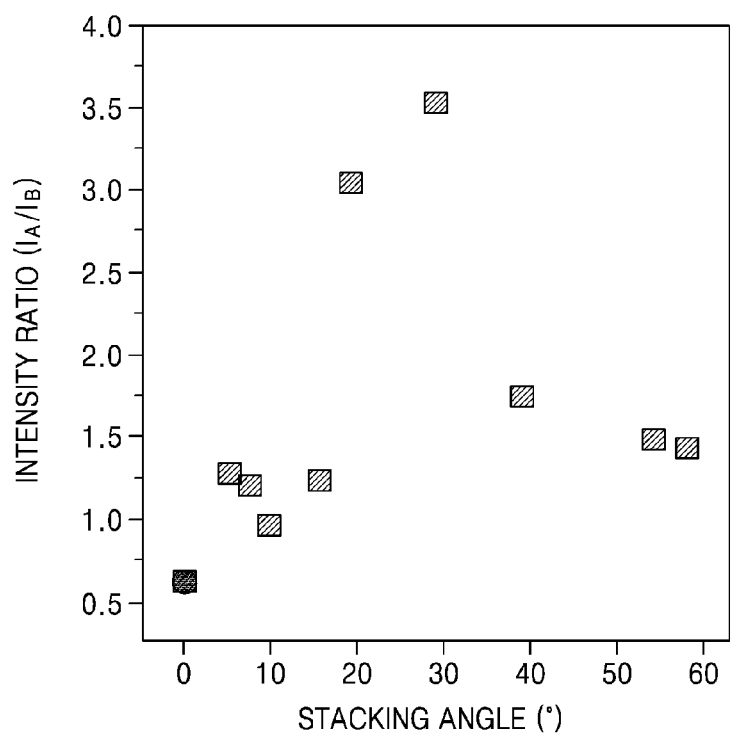
FIG. 4 is a graph illustrating a PL intensity ratio of two layers according to a stacking angle by forming the stacking structure of the two 2D material layers of FIG. 3.

FIG. 3 is a graph showing PL intensities according to a stacking angle of two layers after forming a stacking structure having two 2D material layers. FIG. 4 is a graph showing a PL intensity ratio of two layers according to a stacking angle by forming the stacking structure having the two 2D material layers of FIG. 3. Here, two $MoS_2$ layers are formed by using $MoS_2$ as a 2D material. The PL intensities of the stacking structure 100 were measured after forming the stacking structure 100, in which, for example, the first 2D material layer 11 and the second 2D material layer 12 of FIG. 1 are formed of $MoS_2$, the stacking angle $\alpha1$ between the two 2D material layers 11 and 12 is 0 degree, 5.5 degrees, 8 degrees, 10 degrees, 16 degrees, 20 degrees, 30 degrees, 40 degrees, 56 degrees and 60 degrees.

Referring to FIG. 3, if a stacking angle between two 2D material layers that directly contact with each other is 30 degrees, the PL intensity is the highest, and a stacking angle between 20 degrees and 40 degrees, the PL intensity is relatively high. Also, referring to FIG. 4, a ratio of a PL intensity of exciton A located at 670 nm to a PL intensity of exciton B located at 630 nm is relatively the greatest at the stacking angle between 20 degrees and 40 degrees. It may denote that a Van Der Waals interaction between two 2D material layers is gradually reduced when the stacking angle between the two 2D material layers increases from 0 degree to approximately 30 degrees, but, when the stacking angle increases from approximately 30 degrees to approximately 60 degrees, the Van Der Waals interaction between the two 2D material layers is gradually increased. The Van Der Waals interaction between the two 2D material layers is generally low when a stacking angle between the two 2D material layers is between 20 degrees and 40 degrees, and thus, characteristics, such as, light emission efficiency may be increased.

Also, in a stacking structure in which two $MoS_2$ layers are formed by using $MoS_2$ as a 2D material and stacking angles of each of the 2D material layers are changed, as depicted in FIG. 1, when a stacking angle $\alpha1$ of the two $MoS_2$ layers is increased from 0 degree to 30 degrees, a generated Moire pattern is gradually reduced. When the stacking angle $\alpha1$ of the two $MoS_2$ layers is increased from 30 degrees to 60 degrees, the generated Moire patter is gradually increased, that is, the size of the Moire pattern is the greatest at the stacking angle $\alpha1$ of the two $MoS_2$ layers of 30 degrees, and the size of the Moire pattern is gradually reduced based on the stacking angle $\alpha1$ of 30 degrees. The size of the Moire pattern at the stacking angle $\alpha1$ of 60 degrees is similar to that of the Moire pattern at the stacking angle $\alpha1$ of 0 degree.

As a result, in the stacking structure 100 including a plurality of 2D material layers according to the exemplary embodiment, the 2D material layers are stacked in a twisted state, that is, rotated state by a stacking angle between 20 degrees and 40 degrees based on a wide stacking surfaces between the directly contacting the 2D material layers, and thus, the light emission efficiency of the stacking structure 100 is increased. The 2D material layers included in the stacking structure 100 according to the exemplary embodiment may include a transition metal dichalcogenide (TMD) material. A method of manufacturing the stacking structure 100 including the 2D material layers will be described with reference to FIG. 8.

Figure 8:
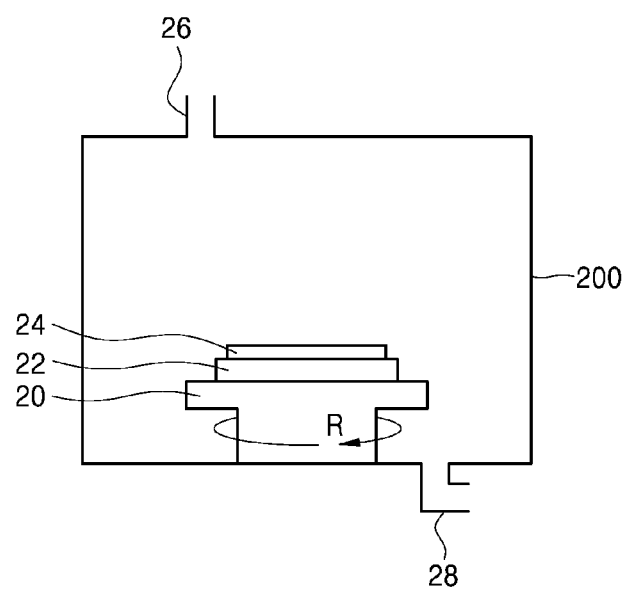
FIG. 8 is a schematic drawing of a CVD chamber structure for manufacturing a stacking structure including 2D material layers according to an exemplary embodiment.

FIG. 8 is a schematic drawing of a structure of a chemical vapor deposition (CVD) chamber for manufacturing a stacking structure including 2D material layers according to an exemplary embodiment.

Referring to FIGS. 1 and 8, a substrate placing unit 20 is formed in a process chamber 200, and a substrate 22 may be placed on the substrate placing unit 20. At least one gas supply unit 26 may be formed in the chamber 200, and a stacking structure 24 may be formed by stacking gas materials supplied from the at least one gas supply unit 26 on the substrate 22. The stacking structure 24 may include a plurality of 2D material layers, and the substrate placing unit 20 may be rotated in a process of forming each of the 2D material layers. For example, as depicted in FIG. 1, after forming the first 2D material layer 11 in advance, the substrate placing unit 20 is rotated about 30 degrees, and the second 2D material layer 12 is formed on the first 2D material layer 11. After forming the second 2D material layer 12, the substrate placing unit 20 is rotated again about 30 degrees, the third 2D material layer 12 may be formed on the second 2D material layer 12. Through this process, the stacking structure 24 including 2D material layers according to the exemplary embodiment may be manufactured. The stacking structure 24 including the 2D material layers described above may be applied to various electronic devices.

Figure 5:
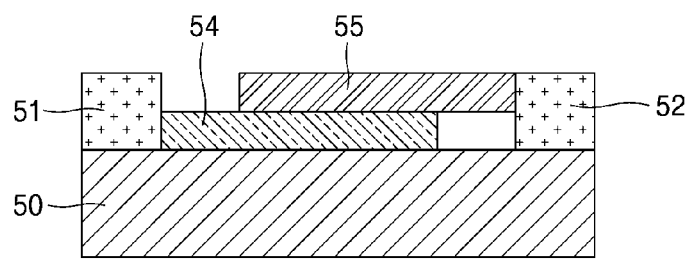
FIG. 5 is a cross-sectional view of a diode structure including 2D material layers according to an exemplary embodiment.

FIG. 5 is a cross-sectional view of a diode structure including 2D material layers according to an exemplary embodiment.

Referring to FIG. 5, a first layer 54 and a second layer 55 may be formed on a substrate 50 or a lower structure 50. A first electrode 51 electrically connected to the first layer 54 and a second electrode 52 electrically connected to the second layer 55 on the lower structure 50. Here, the first layer 54 may be an n-type material layer, and the second layer 55 may be a p-type material layer. If the first layer 54 is an n-type material layer, the second layer 55 may be a p-type material layer. Also, if the first layer 54 is a p-type material layer, the second layer 55 may be an n-type material layer. Here, the n-type material layer or the p-type material layer respectively may be formed by including a general n-type dopant or p-type dopant. Also, a material that constitutes the n-type material layer or the p-type material layer may have an n-type or p-type characteristic.

At least one of the first layer 54 and the second layer 55 may be a stacking structure including 2D material layers according to the current exemplary embodiment. That is, at least one of the first layer 54 and the second layer 55 may have a stacking structure having at least two 2D material layers, and may be formed to have a stacking angle between 20 degrees and 40 degrees between the 2D material layers that directly contact with each other. When one of the first layer 54 and the second layer 55 is a stacking structure including 2D material layers, the other one may be a general semiconductor material layer. For example, if the first layer 54 includes an n-type TMD material, the second layer 55 may include p-type GaN material. The first layer 54 and the second layer 55 may include a metal, an alloy, a conductive metal oxide, or a conductive metal nitride. For example, the first electrode 51 or the second electrode 52 may include Ag, Au, Pt, Al, Fe, Pb, In, Au, or Mo.

Figure 6:
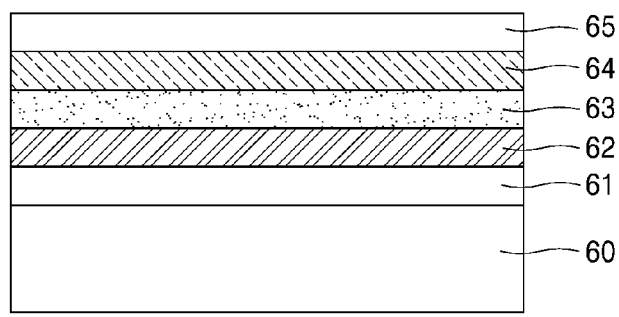
FIG. 6 is a cross-sectional view of a photo-detector or an electroluminescence device including 2D material layers according to an exemplary embodiment.

FIG. 6 is a cross-sectional view of a photo-detector or an electroluminescence (EL) device including 2D material layers according to an exemplary embodiment.

Referring to FIG. 6, a first electrode 61 and a first reflection layer 62 may be formed on a substrate 60 or a lower structure 60, and a stacking structure 63 including 2D material layers according to an exemplary embodiment may be formed on the first reflection layer 62. A second reflection layer 64 and a second electrode 65 may be formed on the stacking structure 63 including 2D material layers. Here, the stacking structure 63 may be a stacking structure including 2D material layers according to the exemplary embodiment. That is, the stacking structure may include at least two 2D material layers, and the 2D material layers included in the stacking structure 63 may be a twisted, that is, rotated by an angle in a range from 20 degrees to 40 degrees on stacking surfaces. The first reflection layer 62 and the second reflection layer 64 may be a generally known distributed Bragg reflection (DBR) stacking structure or a distributed feedback (DFB) stacking structure.

Figure 7:
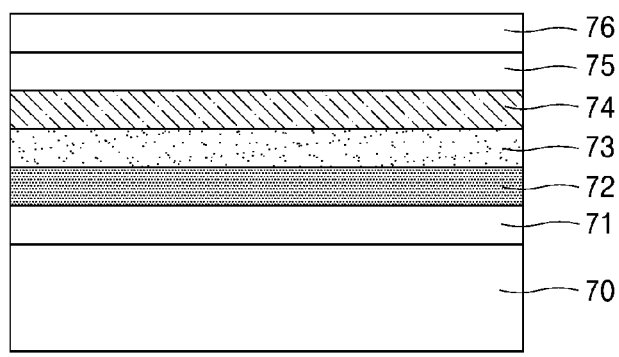
FIG. 7 is a cross-sectional view of a surface-light emitting device including 2D material layers according to an exemplary embodiment.

FIG. 7 is a cross-sectional view of a surface-light emitting device including 2D material layers according to an example embodiment.

Referring to FIG. 7, the surface-light emitting device may include a first electrode 71 on a substrate or a lower structure 70, an electron transfer layer (ETL) 72 on the first electrode 71, and a stacking structure 73 including 2D material layers on the ETL 72. The surface-light emitting device may also include a hole transfer layer (HTL) 74, a conductive polymer layer 75, and a second electrode 76 on the conductive polymer layer 75 and above the stacking structure 73. The stacking structure 73 may be a stacking structure including 2D material layers according to the current example embodiment, and may include at least two 2D material layers. Of the 2D material layers included in the stacking structure 73, the 2D material layers that are in contact with each other respectively may be a stacking structure twisted, that is, rotated by an angle in a range from 20 degrees to 40 degrees on a stacking surface. Here, the first electrode 71 may include a conductive metal, an alloy, a conductive oxide, or a conductive nitride. The ETL 72 may include $TiO_2$. The HTL 74 may include TPD, NPD, or TPAC. The conductive polymer layer 75 may include poly(3,4-ethylenedioxythiophene (PEDOT, and the second electrode 76 may include a transparent conductive material, such as indium-tin-oxide (ITO).

According to an exemplary embodiment, in a stacking structure including a plurality of 2D material layers, a stacking angle between the 2D material layers may be controlled, and thus, a stacking structure in which device characteristics, such as light emission efficiency and an electronic device including the stacking structure may be provided. In this manner, an electrode stacking structure including a plurality of 2D material layers, in which characteristics of the electrode stacking structure are increased, may be readily manufactured.

While one or more exemplary embodiments have been described with reference to the accompanying drawings, it should not be construed as being limited to the exemplary embodiments set forth herein. For example, the electrode stacking structure including 2D material layers according to the one or more exemplary embodiments may be applied to various electronic devices by modifying the electrode stacking structure. Therefore, the scope of the disclosure is defined not by the detailed description, but by the claims and their equivalents, and all variations within the scope of the claims and their equivalents are to be construed as being included in the disclosure.

What is claimed is:

1. An electronic device comprising:
   a stacking structure comprising a plurality of two-dimensional (2D) material layers,
   a first reflection layer formed on a substrate or a lower structure; and
   a second reflection layer formed on the stacking structure,
   wherein the stacking structure is disposed on the first reflection layer,
   wherein a first 2D material layer, among the plurality of 2D material layers, is stacked adjacent to a second 2D material layer, among the plurality of 2D material layers, and
   wherein the first 2D material layer is in a rotated state with respect to the second 2D material layer by a predetermined angle, and
   wherein the stacking structure is configured to generate a Moire pattern based on the predetermined angle, the Moire pattern having a magnitude based on the predetermined angle.

2. The electronic device of claim 1, wherein the first 2D material layer is rotated with respect to the second 2D material layer by the predetermined angle greater than zero.

3. The electronic device of claim 2, wherein the first 2D material layer and the second 2D material layer have a same stacking direction, and wherein the predetermined angle ranges from 20 degrees to 40 degrees based on a direction perpendicular to a wide stacking surface.

4. The electronic device of claim 3, wherein the 2D material layers comprise one of $MoS_2$, $MoSe_2$, $MoTe_2$, $WS_2$, $WSe_2$, $WTe_2$, $HfS_2$, $HfSe_2$, $ZrS_2$, $ZrSe_2$, $NbSe_2$, or $ReSe_2$.

5. The electronic device of claim 3, further comprising:
   a first layer and a second layer formed on a substrate or a lower structure;
   a first electrode electrically connected to the first layer; and
   a second electrode electrically connected to the second layer,
   wherein at least one of the first layer and the second layer is the stacking structure.

6. The electronic device of claim 5, wherein the first layer is a p-type material layer and the second layer is an n-type material layer.

7. The electronic device of claim 5, wherein one of the first layer and the second layer comprises a 2D material layer.

8. The electronic device of claim 5, wherein the 2D material layer comprises a TMD material.

9. The electronic device of claim 1, wherein the first 2D material layer and the second 2D material layer are stacked in a twisted state.

10. The electronic device of claim 9, wherein the 2D material layers comprise a transition metal dichalcogenide (TMD).

11. The electronic device of claim 1, wherein the 2D material layers comprise a metal chalcogenide based material.

12. The electronic device of claim 1, wherein the first and second reflection layers are a distributed Bragg reflection (DBR) stacking structure or a distributed feedback (DFB) stacking structure.

13. The electronic device of claim 1 further comprising:
a first electrode formed between the substrate and the first reflection layer; and
a second electrode formed on the second reflection layer.

14. The electronic device of claim 1, wherein the 2D material layers comprise a TMD material.

15. The electronic device of claim 1, wherein the magnitude of the Moire pattern is gradually reduced as the predetermined angle is increased from 0 degrees to 30 degrees.

16. The electronic device of claim 1, wherein the magnitude of the Moire pattern is gradually increased as the predetermined angle is increased from 30 degrees to 60 degrees.

17. An electronic device comprising:
a stacking structure comprising a plurality of two-dimensional (2D) material layers, wherein a first 2D material layer, among the plurality of 2D material layers, is stacked adjacent to a second 2D material layer, among the plurality of 2D material layers, and wherein the first 2D material layer is rotated with respect to the second 2D material layer;
a first electrode formed on a substrate;
an electron transfer layer formed on the first electrode;
the stacking structure formed on the electron transfer layer;
a hole transfer layer formed on the stacking structure;
a conductive polymer layer formed on the hole transfer layer; and
a second electrode formed on the hole transfer layer.

18. The electronic device of claim 17, wherein the 2D material layers comprise a TMD material.

19. A stacked structure comprising:
a plurality of two-dimensional (2D) material layers,
a first reflection layer formed on a substrate or a lower structure; and
wherein a first 2D material layer, among the plurality of 2D material layers, is stacked adjacent to a second 2D material layer, among the plurality of 2D material layers, and
wherein the first 2D material layer is in a rotated state with respect to the second 2D material layer by a predetermined angle,
wherein the first 2D material layer is disposed on the first reflection layer,
wherein a second reflection layer is formed on the second 2D material layer, and
wherein the stacked structure is configured to generate a Moire pattern based on the predetermined angle, the Moire pattern having a magnitude based on the predetermined angle.

* * * * *